(12) United States Patent
Kimura et al.

(10) Patent No.: US 9,768,786 B2
(45) Date of Patent: Sep. 19, 2017

(54) POWER SYSTEM STABILIZING DEVICE

(71) Applicant: Kabushiki Kaisha Toshiba, Minato-ku (JP)

(72) Inventors: Misao Kimura, Fuchu (JP); Yuji Ishihara, Musashino (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 336 days.

(21) Appl. No.: 14/585,299

(22) Filed: Dec. 30, 2014

(65) Prior Publication Data

US 2015/0194966 A1 Jul. 9, 2015

(30) Foreign Application Priority Data

Jan. 9, 2014 (JP) ................ 2014-002261

(51) Int. Cl.
G05D 3/12 (2006.01)
G05D 5/00 (2006.01)
G05D 9/00 (2006.01)
G05D 11/00 (2006.01)
H03L 5/02 (2006.01)
(Continued)

(52) U.S. Cl.
CPC ............ H03L 5/02 (2013.01); G05B 15/02 (2013.01); H02J 3/04 (2013.01); H02J 3/382 (2013.01); *H02J 2003/007* (2013.01); *Y02E 10/563* (2013.01); *Y02E 60/76* (2013.01); *Y04S 40/22* (2013.01)

(58) Field of Classification Search
CPC .... H03L 5/02; G05B 15/02; H02J 3/04; H02J 3/382; H02J 13/00; H02J 2003/007; Y02E 40/72; Y04S 10/12

USPC .................................................. 700/287–297
See application file for complete search history.

(56) References Cited

U.S. PATENT DOCUMENTS 5,604,420 A * 2/1997 Nambu ................... H02P 9/105
322/19
8,987,930 B2 3/2015 Matzen
(Continued)

FOREIGN PATENT DOCUMENTS

CN 102510071 A 6/2012
CN 103140670 A 6/2013
(Continued)

OTHER PUBLICATIONS

Extended European Search Report issued Oct. 1, 2015 in Patent Application No. 15150368.7.
(Continued)

*Primary Examiner* — Ziaul Karim
(74) *Attorney, Agent, or Firm* — Oblon, McClelland, Maier & Neustadt, L.L.P.

(57) ABSTRACT

A power system stabilizing device includes an arithmetic unit that constructs a system model by collecting various kinds of system information, calculates a transient stability under an assumed accident condition beforehand, and selects, for each assumed accident in advance, a target solar power generator for shutdown and a target power generator to be disconnected to stabilize a power system, and a control unit that shutdowns the shutdown target solar power generator and disconnects the disconnection target power generator from the power system which are selected by the arithmetic unit when a system accident occurs.

2 Claims, 7 Drawing Sheets

(51) Int. Cl.
*G05B 15/02* (2006.01)
*H02J 3/04* (2006.01)
*H02J 3/38* (2006.01)
*H02J 3/00* (2006.01)

(56) References Cited

U.S. PATENT DOCUMENTS

| | | | |
|---|---|---|---|
| 2004/0053082 A1* | 3/2004 | McCluskey | H01M 16/003 |
| | | | 429/9 |
| 2005/0122653 A1 | 6/2005 | McCluskey et al. | |
| 2009/0276173 A1 | 11/2009 | Wang et al. | |
| 2011/0196543 A1* | 8/2011 | Gonz Lez Senosiain | G05F 1/67 |
| | | | 700/287 |
| 2011/0276192 A1* | 11/2011 | Ropp | H02J 3/383 |
| | | | 700/293 |
| 2013/0175801 A1* | 7/2013 | Matzen | F03D 7/0284 |
| | | | 290/44 |
| 2015/0094914 A1* | 4/2015 | Abreu | B60H 1/00742 |
| | | | 701/41 |
| 2015/0377215 A1* | 12/2015 | Agarwal | F03D 7/044 |
| | | | 416/1 |
| 2015/0381103 A1* | 12/2015 | Bischoff | G05B 13/027 |
| | | | 700/287 |
| 2016/0056630 A1* | 2/2016 | Maruhashi | H02J 3/32 |
| | | | 700/287 |
| 2016/0056631 A1* | 2/2016 | Ilo | H02J 3/04 |
| | | | 700/287 |
| 2016/0064934 A1* | 3/2016 | Zhao | H02J 3/32 |
| | | | 700/287 |
| 2016/0072290 A1* | 3/2016 | Cho | H02J 3/24 |
| | | | 700/287 |

FOREIGN PATENT DOCUMENTS

| | | |
|---|---|---|
| CN | 103457268 A | 12/2013 |
| CN | 103457279 A | 12/2013 |
| DE | 101 05 892 A1 | 9/2002 |
| JP | 62-77828 | 4/1987 |
| JP | 2000-92714 | 3/2000 |
| JP | 2001-352678 | 12/2001 |
| JP | 3350265 | 11/2002 |
| JP | 2008-148487 | 6/2008 |

OTHER PUBLICATIONS

Combined Office Action and Search Report issued on Jul. 4, 2016 in Chinese Patent Application No. 201510010008.0 with partial English translation and English translation of category of cited documents.

* cited by examiner

POWER SYSTEM STABILIZING DEVICE

CROSS-REFERENCE TO RELATED APPLICATION

This application is based upon and claims the benefit of priority from Japan Patent Application No. 2014-002261, filed on Jan. 9, 2014, the entire contents of which are incorporated herein by reference.

FIELD

The embodiments of the present disclosure relate to a power system stabilizing device that selects a renewable energy power generator as a control target, and shutdowns the selected renewable energy power generator so that the number of power-control target generators that are necessary for the stabilization of a power system can be decreased.

BACKGROUND

In order to suppress a synchronism loss of power generators at the time of a system accident, there is a scheme of creating an analysis system model based on collected information on a power system, and calculating a transient stability under an accident condition generated after an occurrence of the system accident, thereby determining whether the synchronism loss of the power generator is occurred or not. According to this scheme, a target power generator (a power-control target generator) target to be disconnected that is necessary to suppress a synchronism loss is determined, and then the power-control target generator is disconnected from the power system, thereby making the power system stable.

According to the above-explained scheme of stabilizing the power system, in order to suppress a synchronism loss of power generators at the time of a system accident, some power generators are disconnected from the power system. However, it often takes a time to connect again the disconnected power generator with the power system. Therefore, it is desirable to avoid the disconnection of the power generator as much as possible. Accordingly, the target generators to be controlled are selected to be necessary minimum.

In recent years, an introduction of renewable energy power generators like solar power generators has been advanced. Some renewable energy power generators are connected with a power system through an inverter or a power electronics device so-called a power conditioner, and those can control the operation and the shutdown at a fast speed.

Under such a technical background, it can be thought that the renewable energy power generators may be shutdown instead of disconnecting a power generator to stabilize the power system, or to reduce the number of power-control target generators necessary for the stabilization of the power system. However, there is no actual case in which a renewable energy power generator is subjected to a shutdown.

SUMMARY

The embodiments of the present disclosure have been made to address the aforementioned technical problems, and it is an objective of the present disclosure to provide a power system stabilizing device that selects a renewable energy power generator as a control target, and shutdowns the selected renewable energy power generator so that the number of power-control target generators necessary for the stabilization of a power system may be reduced.

To accomplish the above objective, embodiments of the present disclosure provide a power system stabilizing device for stabilizing a power system installed with a plurality of power generators and a renewable energy power generator, and the device comprises a control unit that shutdowns the renewable energy power generator in response to an occurrence of an accident in the power system.

DETAILED DESCRIPTION

Embodiments of the present disclosure will be explained in detail below with reference to the accompanying drawings.

[First Embodiment]

{Overall Configuration}

Figure 1:
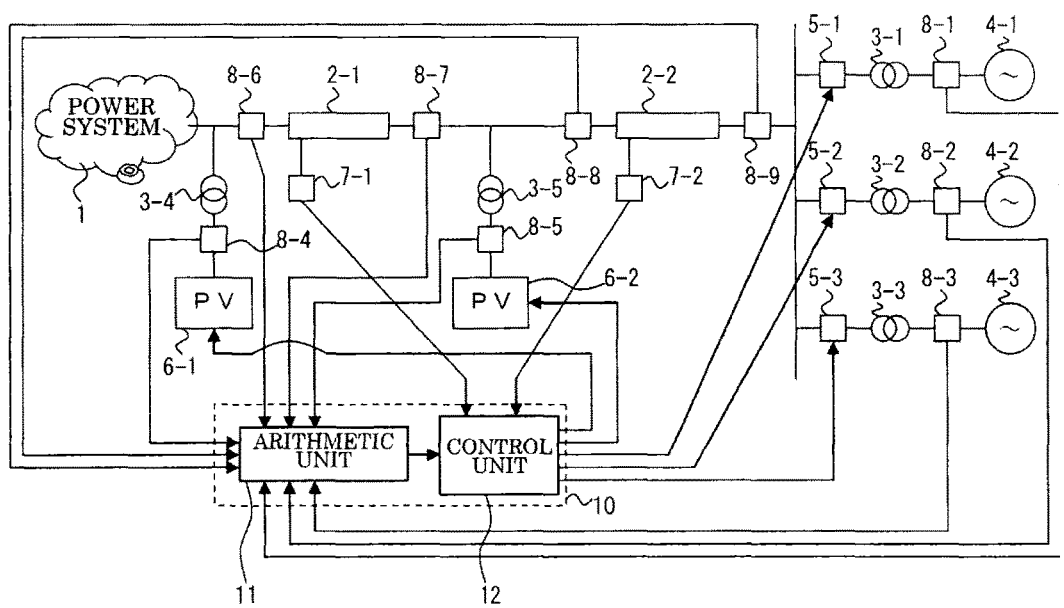
FIG. 1 is an overall view illustrating a configuration of a system utilizing a power system stabilizing device according to a first embodiment of the present disclosure.

FIG. 1 is an overall view illustrating a configuration of a system utilizing a power system stabilizing device according to a first embodiment of the present disclosure.

In FIG. 1, a power generator 4-1 is connected with a power system 1 through a feed line 2-1, a feed line 2-2, a breaker 5-1 and a transformer 3-1. Likewise, a power generator 4-2 is connected with the power system 1 through the feed line 2-1, the feed line 2-2, a breaker 5-2 and a transformer 3-2, and a power generator 4-3 is connected with the power system 1 through the feed line 2-1, the feed line 2-2, a breaker 5-3 and a transformer 3-3. In addition, a solar power generator 6-1 is connected with the power system 1 through a transformer 3-4, and a solar power generator 6-2 is connected with the power system 1 through the feed line 2-1 and a transformer 3-5. A power system stabilizing device 10 for the above-explained power system includes an arithmetic unit 11 and a control unit 12.

The feed line 2-1 is provided with an accident detection device 7-1, while the feed line 2-2 is provided with an accident detection device 7-2. The respective accident detection devices are connected with the control unit 12 through an information transmission network. Hence, information is transmitted to the control unit 12 from the respective accident detection devices 7-1, 7-2. In addition, the feed line 2-1 is provided with information collection devices 8-6, 8-7, while the feed line 2-2 is provided with information collection devices 8-8, 8-9. Still further, the power generator 4-1 is provided with an information collection device 8-1, the power generator 4-2 is provided with an information collection device 8-2, and the power generator 4-3 is provided with an information collection device 8-3. Yet further, the solar power generator 6-1 is provided with an information collection device 8-4, and the solar power generator 6-2 is provided with an information collection device 8-5. The above-explained information collection devices 8-1 to 8-9 are connected with the arithmetic unit 11 through information transmission networks, and thus information is transmitted to the arithmetic unit 11 from the respective information collection devices 8-1 to 8-9.

The control unit 12 is connected with the breakers 5-1, 5-2, and 5-3, and the solar power generators 6-1, 6-2 through information transmission networks, thereby transmitting an instruction value and a setting value thereto. Moreover, the arithmetic unit 11 is connected with the control unit 12. The arithmetic unit 11 has a function of setting in advance a target solar power generator to be shutdown and a target power generator to be disconnected from the power system (hereinafter, referred to as "power-control target generator") to stabilize the power system, that is, to suppress a synchronism loss of the power generators for each assumed accident in accordance with the flowchart of FIG. 2 to be discussed later, and executing this process at a constant time interval like once per an hour. The control unit 12 has a function of outputting a solar power generator shutdown instruction and a disconnection instruction in accordance with the result by the arithmetic unit 11, to shutdown the solar power generator and to disconnect the power generator.

{Action}

A basic action of the power system stabilizing device 10 employing the above-explained configuration will now be explained with reference to the figures.

Figure 2:
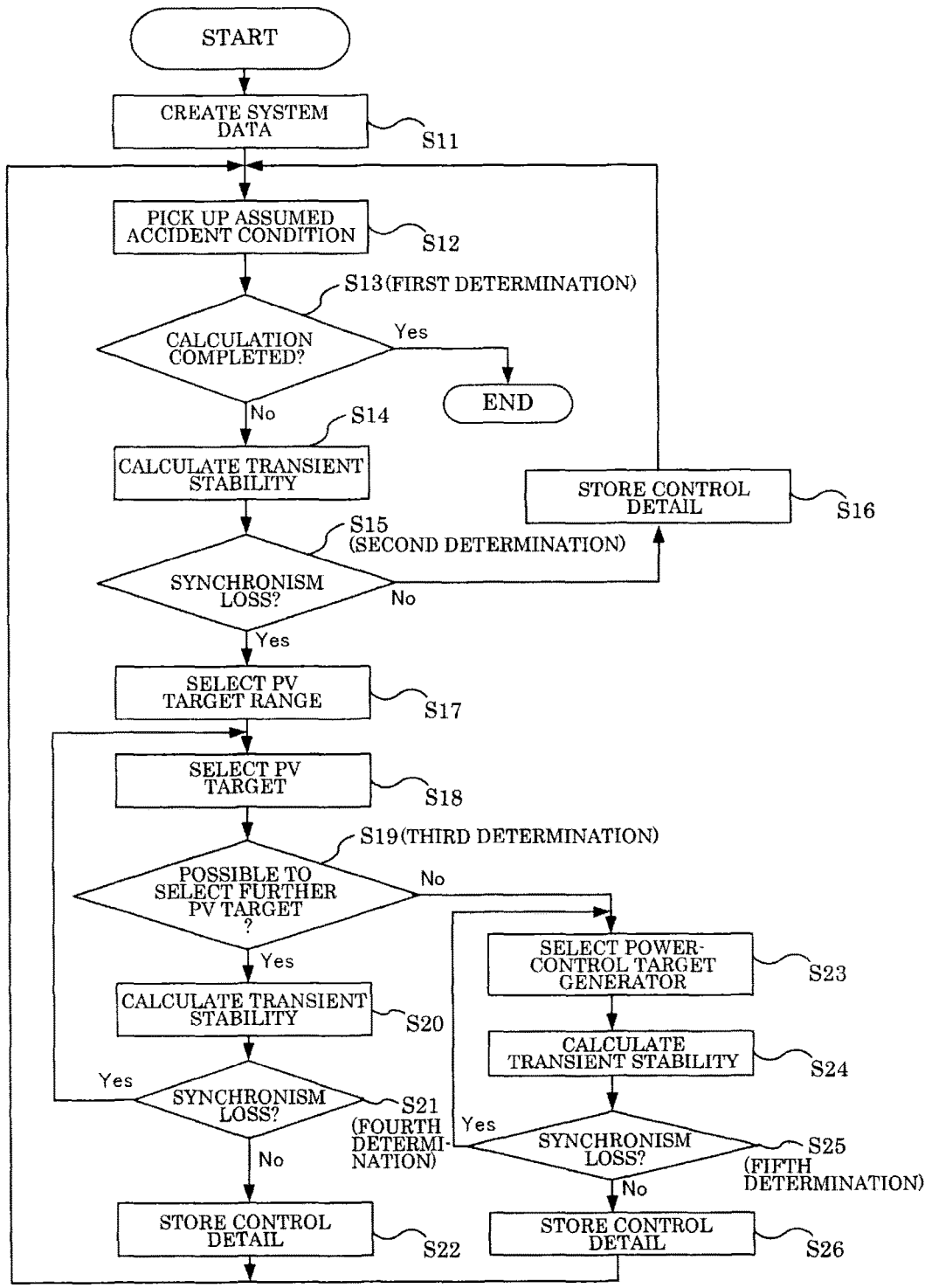
FIG. 2 is a flowchart for explaining a process detail of an arithmetic unit in the power system stabilizing device of the first embodiment.

FIG. 2 is a flowchart for explaining a process detail of the arithmetic unit 11 in the power system stabilizing device 10 of this embodiment. First, the arithmetic unit 11 acquires system information, such as the voltage, the effective power, the reactive power, and the ON/OFF condition of the breaker, measured by the information collection devices 8-1 to 8-9, and creates system data (step S11).

Next, the arithmetic unit 11 picks up one of predetermined conditions of accidents that is assumed to occur (hereinafter, also referred to as "assumed accident conditions") (step S12). The arithmetic unit 11 determines (first determination, step S13) whether or not a calculation of the assumed accident conditions is completed. When the calculation for all assumed accident conditions is completed (step S13: YES), the process is terminated. When the calculation for all assumed accident conditions has not been completed yet (step S13: NO), the arithmetic unit 11 calculates (step S14) a transient stability. Next, the arithmetic unit 11 determines (second determination, step S15) whether or not a power generator would be desynchronized based on the transient stability calculation result. When the arithmetic unit 11 determines, based on the transient stability calculation result, that all of the power generators 4-1 to 4-3 would not be desynchronized (step S15: NO), the arithmetic unit 11 stores, in a memory, a control detail that there is no target solar power generator to be shutdown and there is no power-control target generator, in association with the accident condition (step S16), and the process progresses to the calculation for the next assumed accident condition.

Conversely, when the arithmetic unit 11 determines that at least one of the power generators 4-1 to 4-3 would be desynchronized (step S15: YES), the arithmetic unit 11 selects a range of solar power generators that are effective for suppression of a synchronism loss, and places the selected solar power generators in the order of higher to lower efficiency (step S17). Next, the arithmetic unit 11 selects one solar power generator having a higher rating as a shutdown target among the selected solar power generators (step S18). When the arithmetic unit 11 determines (third determination, step S19: YES) that it is still possible to select a further solar power generator as a shutdown target, the arithmetic unit 11 calculates (step S20) the transient stability to determine (fourth determination, step S21) whether or not a synchronism loss would occur by shutting down the one selected solar power generator. When the arithmetic unit 11 determines no synchronism loss would occur by shutting down the one selected solar power generator (step S21: NO), the arithmetic unit 11 stores, in the memory, a control detail that the one selected solar power generator is to be shutdown but there is no power-control target generator that should be disconnected, in association with the accident condition (step S22), and the process progresses to the next assumed accident condition. Conversely, when the arithmetic unit 11 determines that a synchronism loss would occur (step S21: YES), the arithmetic unit 11 selects another solar power generator having higher rating among the remaining solar power generators in the step S18 as a shutdown target, and calculates the transient stability (step S20) to determine the occurrence/un-occurrence of a synchronism loss (step S21).

By repeating those calculations, the arithmetic unit 11 calculates, in order to suppress a synchronism loss, how many solar power generators selected in the step S17 should be shutdown. When a synchronism loss would occur even if all solar power generators selected in the step S17 are shut down (i.e., no other solar power generator can be selected to be shutdown) (step S19: NO), the arithmetic unit selects a power-control target generator (step S23). The power-control target generators which would be desynchronized may be placed, for example, in the order of larger to smaller output. The arithmetic unit 11 calculates the transient stability (step S24) under the condition in which all of the solar power generators selected in the step S17 are shutdown as well as under the condition including the power-control target generator selected in the step S23, and determines (fifth determination, step S25) whether or a synchronism loss would still occur.

When the arithmetic unit 11 determines no synchronism loss would occur (step S25: NO), the arithmetic unit 11 stores, in the memory, a control detail that the solar power generators selected in the step S17 should be shutdown as a shutdown target, and further the power-control target generator selected at this stage should be disconnected, in association with the accident condition (step S26). When the arithmetic unit 11 determines that a synchronism loss would still occur (step S25: YES), the process is returned to the step S23, and the arithmetic unit 11 calculates the transient stability (step S24) under a condition that another power-control target generator is added, and determines whether or not a synchronism loss would still occur (step S25). By repeating those calculations, the target solar power generators to be shutdown and the power-control target generators, which are necessary to suppress a synchronism loss under the assumed accident condition picked-up in the step S12 can be obtained. By executing those processes for all of the assumed accident conditions, the target solar power generators to be shutdown and the power-control target generators necessary to suppress a synchronism loss in the respective accident conditions can be obtained.

Figure 3:
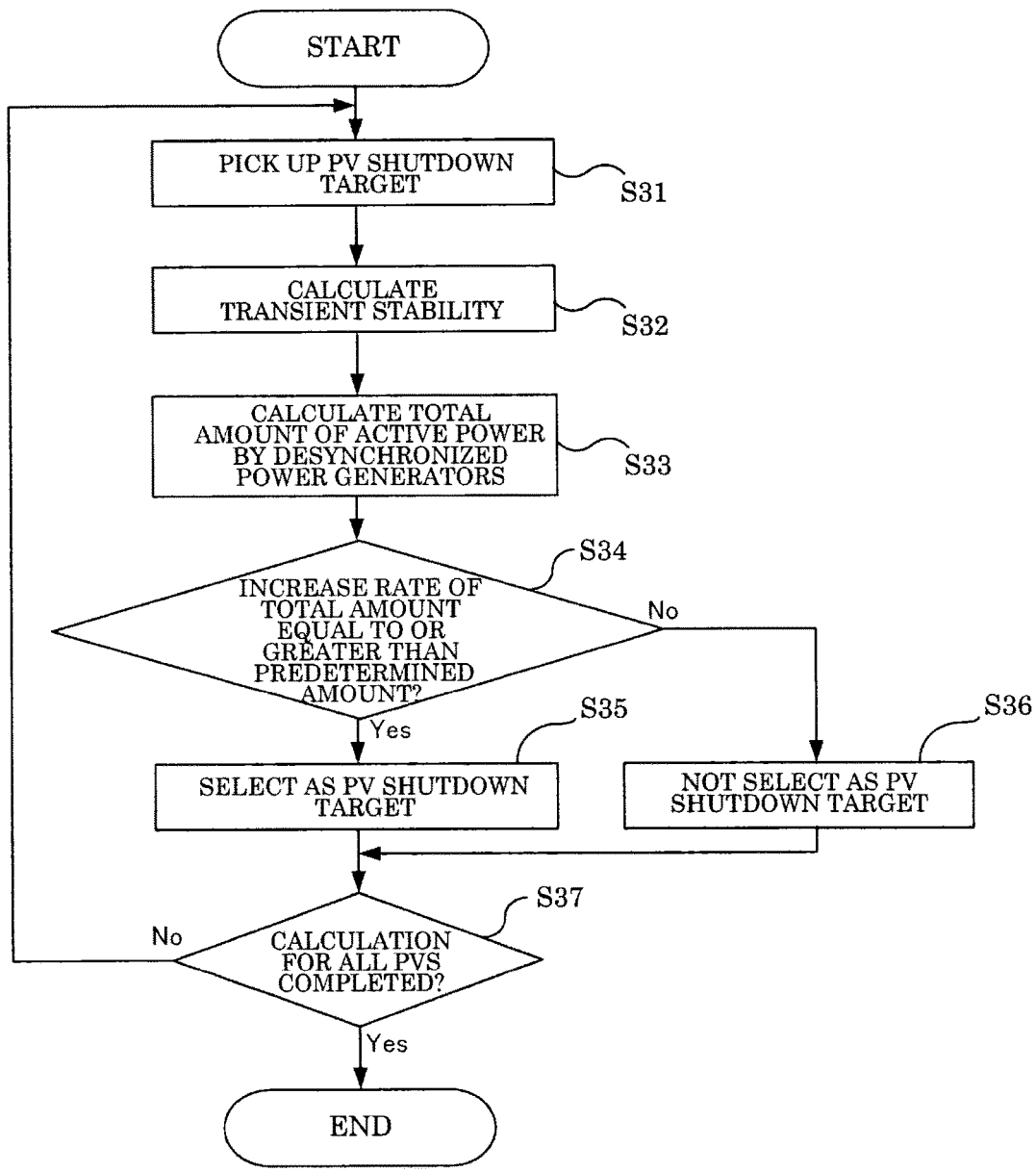
FIG. 3 is a flowchart for explaining a process detail of selecting a shutdown target range of a solar power generator in the first embodiment.

FIG. 3 is a flowchart for explaining a process detail of selecting a shutdown target range of solar power generators according to the first embodiment of the present disclosure, that is a specific example of step S17 in FIG. 2.

First, the arithmetic unit 11 picks up (step S31) the solar power generators one by one as a shutdown target. The arithmetic unit 11 calculates the transient stability (step S32) under the condition that each solar power generator would be shutdown. The arithmetic unit 11 calculates the total amount value of active power of the power generators that would cause a synchronism loss in the transient stability calculation in the step S14 of the flowchart of FIG. 2 under the condition that each of the solar power generators is shutdown (step S33). The arithmetic unit 11 determines (step S34) whether or not the increase rate of the total amount value is equal to or greater than a predetermined value. Shutdown of the solar power generator that is effective for suppressing a synchronism loss causes large increase of the active power of the desynchronized power generator. Hence, when the increase rate of the total amount value is equal to or greater than the predetermined value (step S34: YES), the arithmetic unit 11 selects the solar power generator as a shutdown target (step S35), and when the increase rate is smaller than the predetermined value (step S34: NO), the arithmetic unit 11 selects does not select the solar power generator as a shutdown target (step S36). Next, the arithmetic unit 11 determines (step S37) whether or not the calculation for all of the solar power generators is completed, and when such a calculation has not been completed yet (step S37: NO), the process returns to the step S31. When the calculation is completed (step S37: YES), the process is terminated.

Next, an action of the control unit 12 will be explained.

When a short-circuit or an earth-fault accident occurs in the feed line 2-1 or 2-2, the accident detection device 7-1 or 7-2 detects an occurrence of the accident, and notifies the control unit 12 of the occurrence of the accident and the kind thereof. In response to the occurrence of the accident in the power system, the control unit 12 reads a control detail, that is calculated in advance by the arithmetic unit 11, of the assumed accident condition of which location and kind match to those of the accident that is actually occurring. That is, the control unit 12 reads information on the shutdown target solar power generator and the power-control target generator, that are necessary to suppress a synchronism loss. Next, the control unit 12 transmits a shutdown instruction to the target solar power generator to shutdown the target solar power generator, and also transmits a disconnection instruction to the power-control target generator to disconnect the power-control target generator.

The synchronism loss of the power generators upon a short-circuit or an earth-fault accident is mainly caused by a voltage decrease during the accident and a reduction of the active power by the power generator due to an impedance change after the accident is resolved. An internal phase angle δ of the power generator can be obtained from the formula (1), and when an active power Pe decreases, the phase angle δ increases. In the following formula, M is a unit inertia constant of the power generator, Pm is a machinery input, Δω is an angular frequency deviation, and δ₀ is an initial value of the internal phase angle. The reduction of active power varies depending on a positional relationship between the location (the accident point) where the system accident occurs and the location of the power generator, and a power flow condition. In roughly speaking, the power generator which is located near the accident point (impedance from the accident point is small) and which is the termination power generator from the accident point, in other words, the power generator that has transmitted active power toward the accident point before the occurrence of the accident has the active power which is likely to decrease largely, and also has a large increase in phase angle δ. Next, when the phase angle difference from other power generators becomes equal to or larger than a certain level, it becomes difficult to maintain the synchronism of the power generator, and thus a synchronism loss occurs.

[Formula 1]

$$\delta = \omega_0 \int \Delta\omega dt + \delta_0 \\ \Delta\omega = \frac{1}{M} \int (P_m - P_e) dt \quad (1)$$

Conversely, when the solar power generator is shutdown, the supply amount of the active power decreases by what corresponds to the shutdown. Hence, the power generators increase the active power to maintain the supply/demand balance of the energy. Increase in active power Pe results in a suppression of an increase in phase angle δ or decreases such a phase angle difference. Hence, a shutdown of the solar power generator results in a suppression of a synchronism loss. The same is true of a suppression of a synchronism loss by electric control. If the increase in active power necessary to suppress a synchronism loss is 100 and there is an effect of increasing the active power by 50 upon shutdown of the solar power generator, it is enough to perform an electric control by what corresponds to the remaining 50. Therefore, a synchronism loss can be suppressed with a smaller number of power-control target generators in comparison with the electric control accomplishing an effect by what corresponds to active power increase of 100.

{Advantageous Effects}

As explained above, according to this embodiment, a target solar power generator to be shutdown and a power-control target generator necessary for suppressing a synchronism loss are determined in advance for each assumed accident condition, and when an accident occurs, the target solar power generator necessary for suppressing a synchronism loss and matching the accident condition is shutdown, and the power-control target generator is disconnected from the power system. Hence, it becomes possible for the power system stabilizing device in advance to prevent a synchronism loss of the power generators. In addition, the number of power-control target generators can be reduced in comparison with a case in which only power generators are disconnected.

[Second Embodiment]

{Configuration}

An explanation will be given of a power system stabilizing device according to a second embodiment of the present disclosure with reference to FIGS. 4 and 5.

Figure 4:
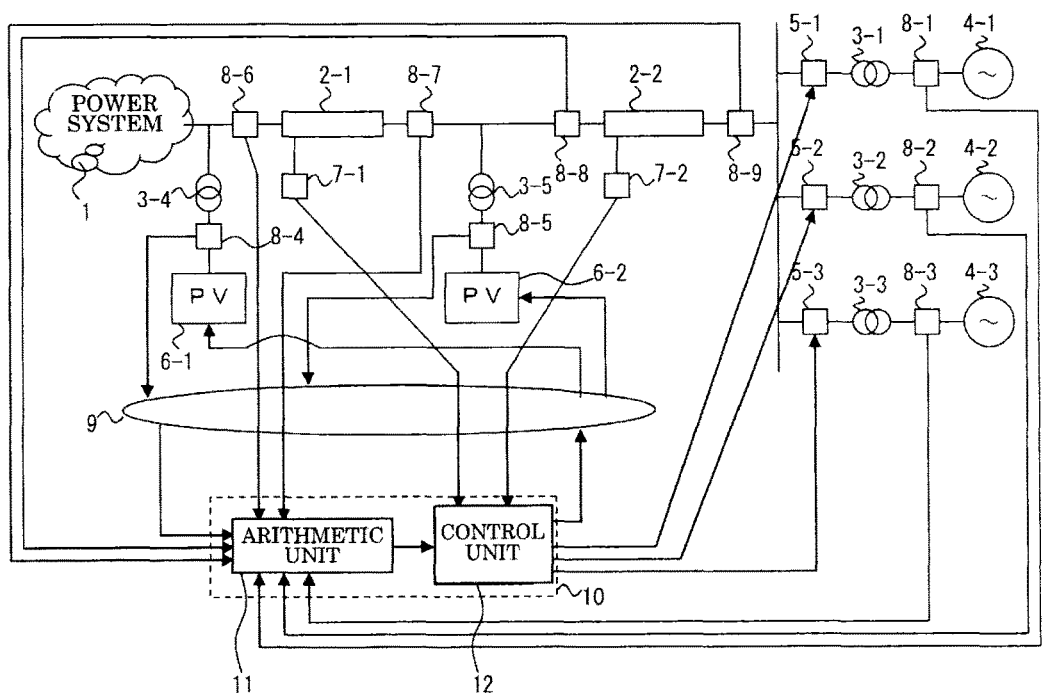
FIG. 4 is an overall view illustrating a configuration of a system utilizing a power system stabilizing device according to a second embodiment of the present disclosure.

FIG. 4 is an overall view illustrating a configuration of a system utilizing the power system stabilizing device of the second embodiment. The same component as that of the first embodiment will be denoted by the same reference numeral, and the duplicated explanation thereof will be omitted.

In the second embodiment, the differences from the first embodiment illustrated in FIG. 1 are that the arithmetic unit 11 acquires information from the information collection device 8-4 of the solar power generator 6-1 and the information collection device 8-5 of the solar power generation device 6-2 through a public line 9, and the control unit 12 gives a shutdown condition to the solar power generators 6-1 and 6-2 through the public line 9. In this case, a conventional communication network is applicable as the public line 9 of this example.

Figure 5:
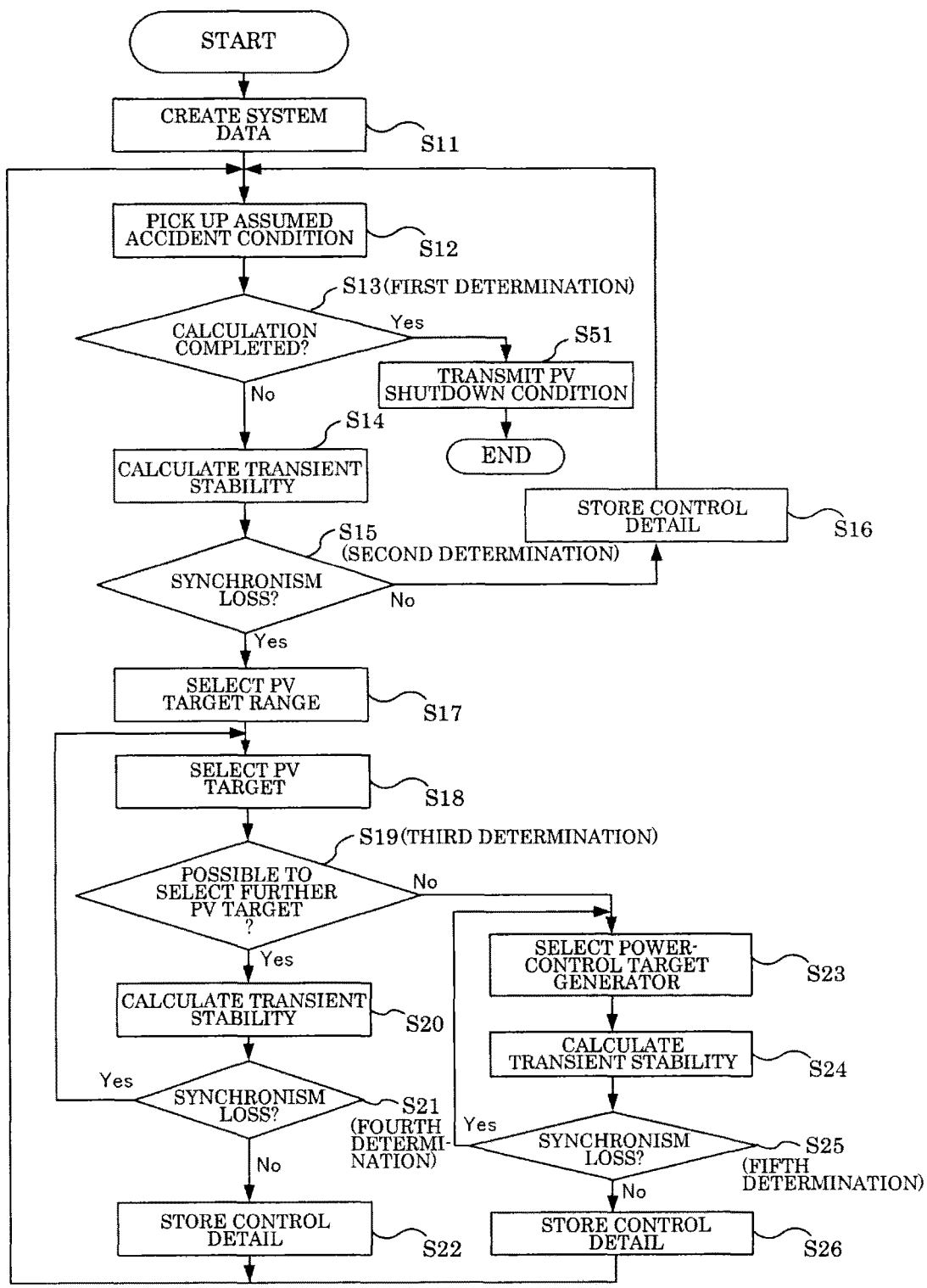
FIG. 5 is a flowchart for explaining a process detail of an arithmetic unit in the power system stabilizing device of the second embodiment.

FIG. 5 is a flowchart for explaining a process detail of the arithmetic unit 11 in the power system stabilizing device 10 of the second embodiment. In the second embodiment, the difference from the flowchart of the first embodiment in FIG. 2 is that step S51 is added when the determination is YES in the step S13.

{Action}

The arithmetic unit 11 determines, for each assumed accident, the target solar power generator to be shutdown and the power-control target generator in advance like the first embodiment. When the processes of determining the target solar power generator to be shutdown and the power-control target generator complete for all assumed accident conditions (step S13: YES), the process progresses to the step S51.

In the step S51, a shutdown condition is transmitted to the solar power generator that became a shutdown target for at least one of the assumed accident conditions. The shutdown condition contains, for example, a voltage decrease threshold to shutdown the solar power generator and a shutdown time. When the own end voltage becomes lower than the voltage decrease threshold in the shutdown condition due to, for example, an earth-fault accident, the solar power generator that has received the shutdown condition stops the operation by the shutdown time. Hence, the solar power generator selected in advance is shutdown when an assumed accident occurs actually. An example scheme of setting the voltage decrease threshold is to set a value obtained by adding a certain margin to the voltage value of the target solar power generator to be shutdown during an accident based on the transient stability calculation result in the step S14 in FIG. 5. In addition, the shutdown time may be set in advance in consideration of the system characteristics acquired through a system analysis beforehand.

In this example, it is presumed that the information transmission through the public line 9 contains a delay in an order of equal to or greater than a second. If the solar power generator shutdown and the electric control are performed several seconds after the occurrence of an accident, it is difficult to prevent a synchronism loss. Hence, it is necessary to notify the solar power generator of the shutdown condition in advance when a relatively slow transmission network is utilized. It is presumed that there are fast-speed transmission networks between the power system stabilizing device 10 and the breakers 5-1 to 5-3.

{Advantageous Effects}

As explained above, according to this embodiment, even if the conventional communication network between the power system stabilizing device 10 and the solar power generators 6-1, 6-2 has a transmission delay in an order of equal to or greater than a second, a synchronism loss can be prevented using a conventional transmission network without the need of a new fast-speed transmission network, and the number of power-control target generators can be reduced in comparison with a case in which only the power generators are subjected to electric control.

[Third Embodiment]

{Configuration}

An explanation will be given of a power system stabilizing device according to a third embodiment of the present disclosure with reference to FIGS. 6 and 7.

Figure 6:
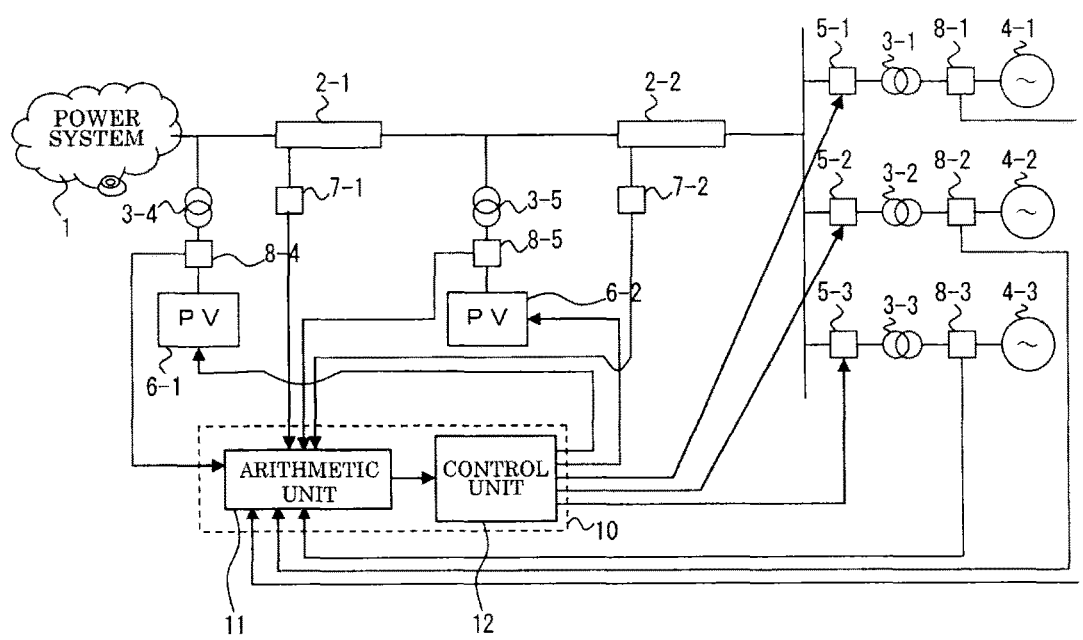
FIG. 6 is an overall view illustrating a configuration of a system utilizing a power system stabilizing device according to a third embodiment of the present disclosure.

FIG. 6 is an overall view illustrating a configuration of a system utilizing the power system stabilizing device of the third embodiment. The same component as that of the first embodiment will be denoted by the same reference numeral, and the duplicated explanation thereof will be omitted.

In the third embodiment, the differences from the first embodiment in FIG. 1 are that the information collection devices 8-6 to 8-9 are eliminated and output signals by the accident detection devices 7-1 and 7-2 are input to the arithmetic unit 11.

{Action}

Figure 7:
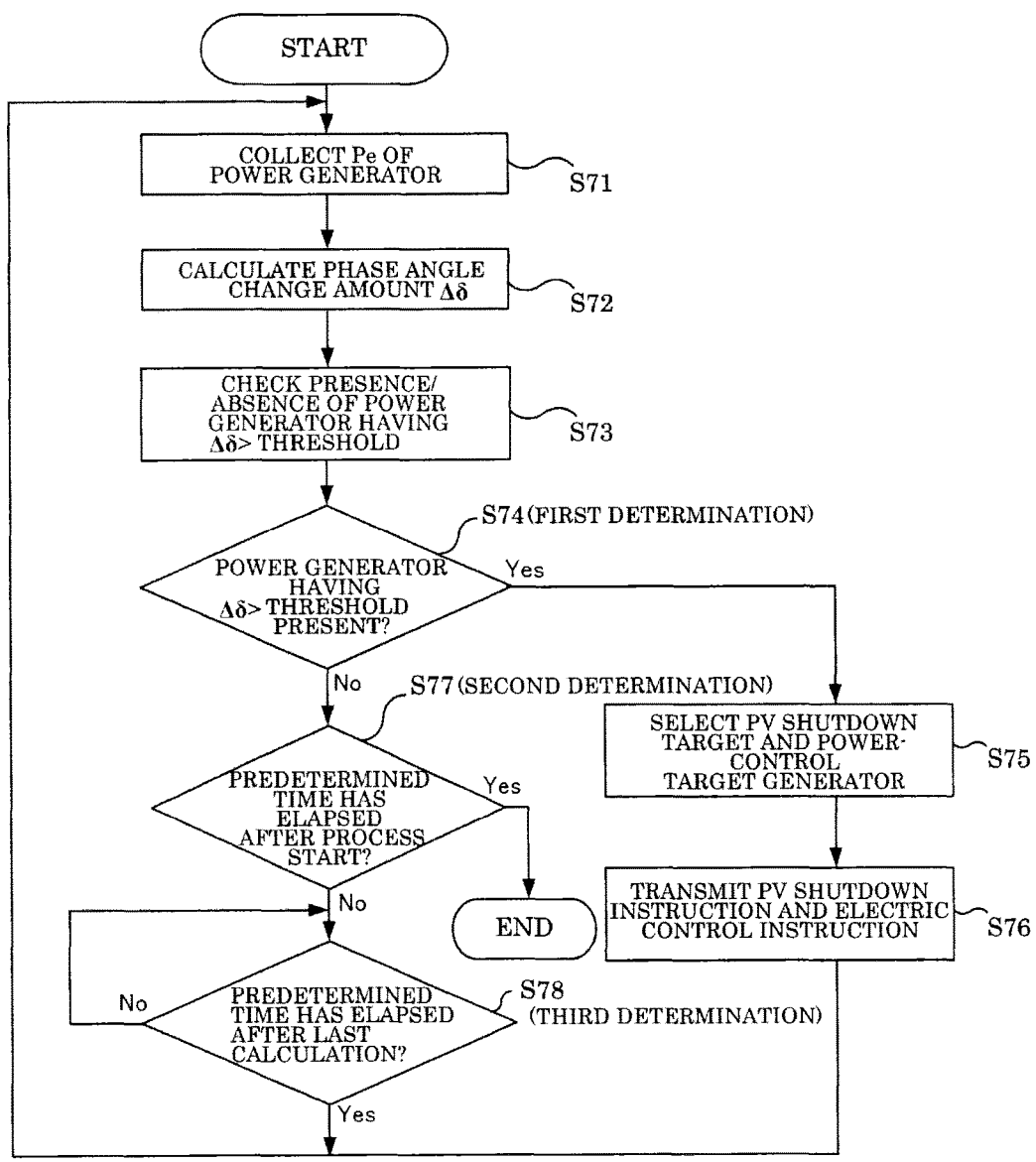
FIG. 7 is a flowchart for explaining a process detail of an arithmetic unit in the power system stabilizing device of the third embodiment.

FIG. 7 is a flowchart for explaining a process detail of the arithmetic unit 11 in the power system stabilizing device 10 of the third embodiment.

When a short-circuit or an earth-fault accident occurs, the accident detection device 7-1 or 7-2 detects the accident, and the arithmetic unit 11 is notified of the occurrence of the accident, the process illustrated in the flowchart of FIG. 7 starts. First, the arithmetic unit 11 collects (step S71) the active power Pe of the power generators, and calculates (step S72) a change amount $\Delta\delta$ of the internal phase angle $\delta$ of each power generator through the above-explained formula (1). At this time, it is presumed that the necessary constants like an inertia constant are set in advance and the power generator subjected to a calculation of the change amount $\Delta\delta$ of the internal phase angle $\delta$ is selected beforehand for operated or shutdown conditions.

Next, the arithmetic unit 11 checks (step S73) whether or not there is a power generator of which change amount $\Delta\delta$ of the internal phase angle calculated exceeds a predetermined threshold. In this case, such a threshold is set for each power generator. Subsequently, the arithmetic unit 11 determines (first determination, step S74) whether or not, other than the power-control target generators, there is a power generator of which the change amount $\Delta\delta$ of the internal phase angle exceeds a threshold. When there is the exceeding power generator (step S74: YES), this power generator is selected as a power-control target generator, and the solar power generator associated in advance with the power-control target generator is set as the shutdown target (step S75). As to the association of the solar power generator with the power generator, for example, the transient stability is calculated under the condition of shutting down each solar power generator one by one, and the power generator, that has the active power increase by the solar power generator is equal to or greater than a certain value, is combined with that solar power generator. In addition, the arithmetic unit 11 transmits, through the control unit 12, the shutdown instruction to the shutdown target solar power generator to stop the operation thereof, and also transmits the electric control instruction to the power-control target generator to disconnect this power generator (step S76).

Conversely, when the arithmetic unit 11 determines that there is no power generator of which $\Delta\delta$ exceeds the threshold (step S74: NO), the arithmetic unit 11 determines (second determination, step S77) whether or not a predetermined time has elapsed after the start of the process. When the predetermined time has elapsed (step S77: YES), the process is terminated. When the predetermined time has not elapsed yet (step S77: No), the arithmetic unit 11 determines (third determination, step S78) whether or not the cycle of calculation and evaluation of the change amount $\Delta\delta$ of the internal phase angle has elapsed. When it becomes a next calculation time after a predetermined time has elapsed (step S78: YES), the arithmetic unit 11 starts the process from the step S71. In this way, the calculation and evaluation of the change amount $\Delta\delta$ of the internal phase angle are performed for the predetermined time cycle like 10 milliseconds to determine the target solar power generator to be shutdown and the power-control target generator which are effective for suppressing a synchronism loss of the power generators. The shutdown of the target solar power generator and the electric control of the power-control target generator are performed. After the first shutdown of the solar power generator and the disconnection of the power-control target generator, when the arithmetic unit 11 determines in the calculation and the evaluation that there is a power generator of which change amount $\Delta\delta$ of the internal phase angle exceeds the threshold among the remaining power generators, the shutdown of solar power generator and the electric control are performed repeatedly by multiple times, such as twice, and three times.

Like the first embodiment, the shutdown of the solar power generator increases the active power by the power generators in comparison with a case in which no solar power generator is shutdown. Hence, an increase in change amount $\Delta\delta$ of the internal phase angle can be reduced. Therefore, in comparison with a case in which only power generator is disconnected, the possibility that the change amount $\Delta\delta$ of the internal phase angle exceeds the threshold can be reduced, thereby decreasing the needs of second, third disconnection of the power generator.

{Advantageous Effects}

As explained above, according to this embodiment, the power-control target generator is selected in accordance with a change amount of the internal phase angle of the power generator calculated on the basis of the power generator active power after an occurrence of an accident and the power generator constant, and such a power generator is disconnected from the power system. At the same time, the solar power generator associated with that power-control target generator is shutdown. Thus, a synchronism loss can be suppressed beforehand. The number of power-control target generators can be reduced in comparison with a case in which only the power generator is disconnected.

[Other Embodiments]

(1) In the above-explained embodiments, a solar power generator is employed as an example of shutdown target other than the power generator. However, the present disclosure is not limited to such a target. For example, other power generation device like a wind power generator, which is interconnected with the system through an inverter or a power electronics device so-called a power conditioner, may be selected as a shutdown target.

(2) The respective numbers of the power generators 4, the breakers 5, the transformers 3, the solar power generators 6, the accident detection devices 7, and the information collection devices 8 are not limited to the above-explained numbers, and can be optional numbers as needed.

(3) While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A power system stabilizing device for stabilizing a power system installed with a plurality of power generators and a renewable energy power generator, the device comprising:
    an accident detection device that detects an occurrence of accident;
    an information collection device that acquires system information including a voltage, an effective power, a reactive power, and an ON/OFF condition of a breaker;
    an arithmetic unit that constructs a system model based on the information of the power system acquired by the information collection device, calculates a transient stability for all assumed conditions beforehand, and selects, to stabilize the power system for each accident assumed to occur, a target renewable energy power generator to be shutdown and a target power generator;
    a control unit that disconnects the power generator and the renewable energy generator that are selected beforehand by the arithmetic unit when the accident detection device detects the accident of the power system,
    wherein the arithmetic unit narrows down candidates of the renewable energy power generator to be shutdown based on a calculation result of a change amount of a power generator active power under a condition which the renewable energy power generator is shutdown,
    wherein the arithmetic unit selects the target renewable energy power generator to be shutdown, while selecting the power generator to be disconnected in accordance with a change amount of an internal phase angle of the power generator calculated from the power generator active power and a power generator constant after the occurrence of the accident.

2. The power system stabilizing device according to claim 1, wherein the control unit transmits, prior to the occurrence of the accident, to the target renewable energy power generator to be shutdown selected by the arithmetic unit, a shutdown condition of the target renewable energy power.

* * * * *